(12) United States Patent
Bolotin

(10) Patent No.: US 7,155,813 B2
(45) Date of Patent: Jan. 2, 2007

(54) PROGRAMMER SYSTEMS

(75) Inventor: Lev M. Bolotin, Kirkland, WA (US)

(73) Assignee: Data I/O Corporation, Redmond, WA (US)

( * ) Notice: Subject to any disclaimer, the term of this patent is extended or adjusted under 35 U.S.C. 154(b) by 210 days.

(21) Appl. No.: 10/797,999

(22) Filed: Mar. 10, 2004

(65) Prior Publication Data
US 2004/0262128 A1 Dec. 30, 2004

Related U.S. Application Data

(62) Division of application No. 09/471,667, filed on Dec. 24, 1999, now Pat. No. 6,732,853.

(60) Provisional application No. 60/164,785, filed on Nov. 10, 1999.

(51) Int. Cl.
B65G 17/32 (2006.01)
B65G 15/58 (2006.01)
B65G 1/00 (2006.01)

(52) U.S. Cl. ............... 29/739; 198/378; 198/468.2; 198/468.6; 198/750.11; 198/750.12; 414/226.01; 414/226.02; 414/751.1; 414/752.1; 414/753.1; 414/222.02; 414/225.01; 29/740; 29/741; 29/742

(58) Field of Classification Search ............ 198/378, 198/468.2, 468.6, 750.11, 750.12; 414/222.02, 414/225.01, 226.02, 751.1, 752.1, 753.1, 414/226.01; 29/742, 740, 739, 741
See application file for complete search history.

(56) References Cited

U.S. PATENT DOCUMENTS

| 5,084,959 | A | * | 2/1992 | Ando et al. ................. 29/740 |
| 5,093,984 | A | * | 3/1992 | Lape ........................ 29/741 |
| 5,596,270 | A | * | 1/1997 | Mitsui .................... 324/158.1 |
| 5,651,176 | A | * | 7/1997 | Ma et al. .................... 29/740 |
| 6,230,067 | B1 | * | 5/2001 | White ....................... 700/112 |
| 6,427,320 | B1 | * | 8/2002 | Seto et al. ................... 29/740 |
| 6,519,838 | B1 | * | 2/2003 | Okuda et al. ................ 29/740 |
| 6,591,486 | B1 | * | 7/2003 | Bolotin ...................... 29/740 |
| 2001/0027877 | A1 | * | 10/2001 | Kuribayashi et al. ....... 174/260 |
| 2003/0233749 | A1 | * | 12/2003 | Bolotin ...................... 29/742 |

* cited by examiner

Primary Examiner—Gene O. Crawford
Assistant Examiner—Leslie A. Nicholson, III
(74) Attorney, Agent, or Firm—Mikio Ishimaru

(57) ABSTRACT

A micro device using assembly system for feeding, programming, and placing micro devices on circuit boards includes a robotic handling system capable of picking up and placing the micro devices on the circuit boards on a conveyor system. A control system controls the conveyor system and the robotic handling system. An input feeder provides the micro devices and a programming system is capable of programming a plurality of micro devices in sockets which are in line parallel with the input feeder. The input feeder responds to communication with the control system to feed the unprogrammed micro devices while the programming system programs the micro devices and communicates to the control system. The robotic handling system responds to communication of the programming system with the control system to pickup and places the programmed micro devices on the circuit boards at high speed.

22 Claims, 3 Drawing Sheets

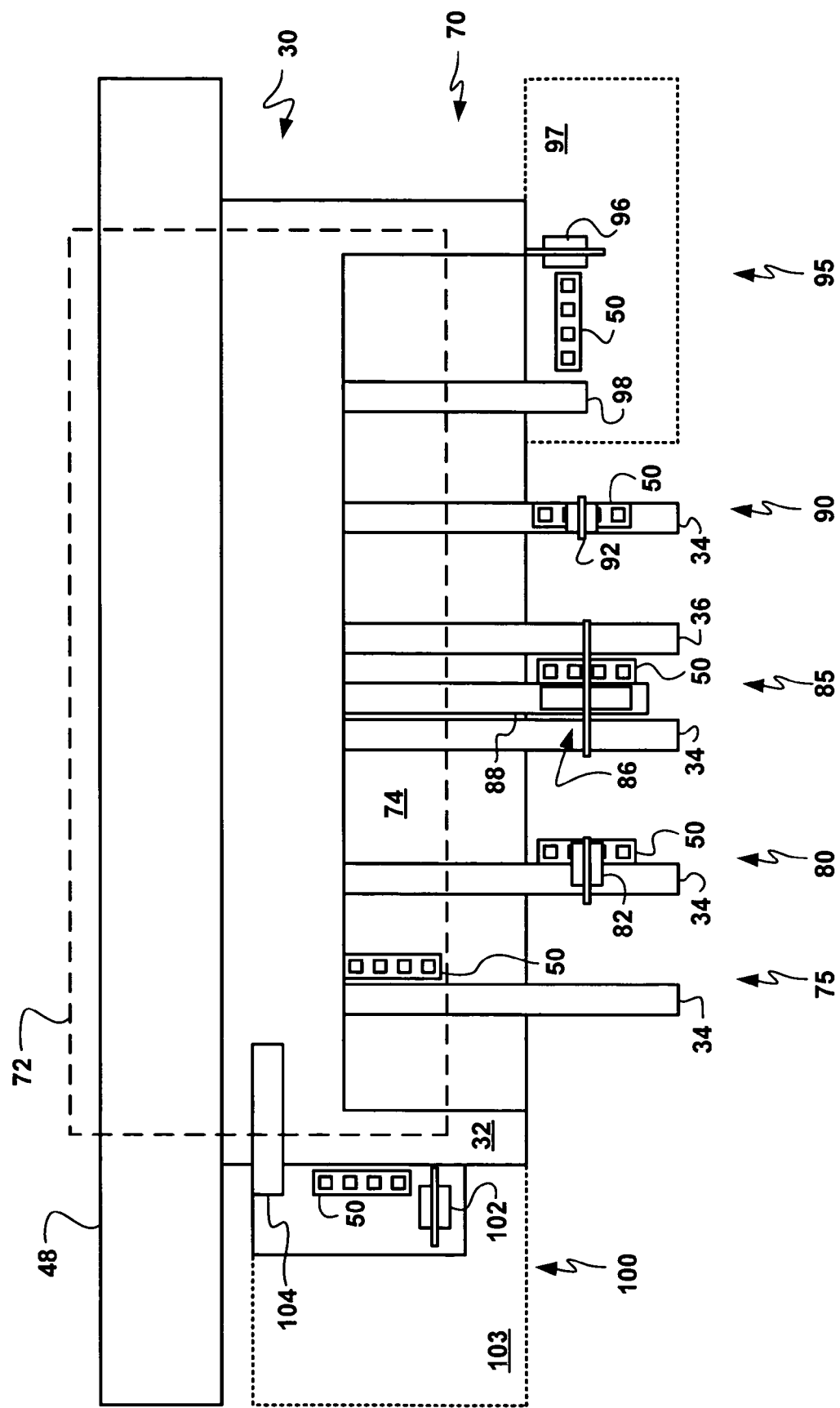

PROGRAMMER SYSTEMS

CROSS-REFERENCE TO RELATED APPLICATION(S)

This is a Divisional of application Ser. No. 09/471,667 filed Dec. 24, 1999, now U.S. Pat. No. 6,732,853 which claims the benefit of U.S. Provisional Patent Application 60/164,785, filed on Nov. 10, 1999, which is incorporated herein by reference thereto.

The present application contains subject matter related to a concurrently filed U.S. patent application Ser. No. 09/471,675, now U.S. Pat. No.: 6,535,780 B1, by George Leland Anderson, Robert Edward Cameron, and Scott Allen Fern entitled "HIGH SPEED PROGRAMMER SYSTEM". The related application is assigned to Data I/O Corporation, and is hereby incorporated by reference.

The present application also contains subject matter related to a concurrently filed U.S. patent application Ser. No. 09/471,634, now U.S. Pat. No.: 5,657,426 B1. by Bryan D. Powell, George Leland Anderson, Lev M. Bolotin, and Robin Edward Cameron entitled "PROGRAMMER". The related application is assigned to Data I/O Corporation, and is hereby incorporated by reference.

TECHNICAL FIELD

The present invention relates generally to electronic manufacturing systems and more particularly to programmable device programmers and systems.

BACKGROUND ART

In the past, certain operations of electronic circuit board assembly were performed away from the main production assembly systems. While various feeder machines and robotic handling systems would populate electronic circuit boards with integrated circuits, the operations related to processing integrated circuits, such as programming, testing, calibration, and measurement were performed in separate areas on separate equipment rather than being integrated into the main production assembly systems.

For example, in the programming of programmable devices such as electrically erasable programmable read-only memories (EEPROMs) and Flash EEPROMs, separate programming equipment was used which was often located in a separate area from the circuit board assembly systems. There were a number of reasons why programming was done off-line.

First, the programming equipment was relatively large and bulky. This was because of the need to accurately insert and remove programmable devices at high speeds into and out of programming sockets in the programmer. Since insertion and removal required relatively long traverses at high speed and very precise positioning, very rigid robotic handling equipment was required. This rigidity requirement meant that the various components had to be relatively massive with strong structural support members to maintain structural integrity and precision positioning of the pick and place system moving at high speeds. Due to the size of the programming equipment and the limited space for the even larger assembly equipment, they were located in different areas.

Second, a single high-speed production assembly system could use up programmed devices faster than they could be programmed on a single programming mechanism. This required a number of programming systems, which were generally operated for longer periods of time in order to have a reserve of programmed devices for the production assembly systems. This meant that the operating times and the input requirements were different between the two systems.

Third, no one had been able to build a single system which could be easily integrated with both the mechanical and electronic portions of the production assembly systems. These systems are complex and generally require a great deal of costly engineering time to make changes to incorporate additional equipment.

A major problem associated with programming the programmable devices in a separate area and then bringing the programmed devices into the production assembly area to be inserted into the electronic circuit boards was that it was difficult to have two separate processes running in different areas and to coordinate between the two separate systems. Often, the production assembly system would run out of programmable devices and the entire production assembly system would have to be shut down. At other times, the programming equipment would be used to program a sufficient inventory of programmed devices to assure that the production assembly system would not be shut down; however, this increased inventory costs. Further problems were created when the programming had to be changed and there was a large inventory of programmed integrated circuits on hand. In this situation, the inventory of programmable devices would have to be reprogrammed with an accompanying waste of time and money.

While it was apparent that a better system would be desirable, there appeared to be no way of truly improving the situation. There were a number of apparently insurmountable problems that stood in the way of improvement.

First, the operating speeds of current production assembly systems so greatly exceeded the programming speed capability of conventional programmers that the programmer would have to have a much greater through-put than thought to be possible with conventional systems.

Second, not only must the programmer be faster than existing programmers, it would also have to be much smaller. The ideal system would integrate into a production assembly system, but would do so without disturbing an existing production assembly system or requiring the lengthening of a new production assembly system over that of the length without the ideal system. Further, most of these production assembly systems were already filled with, or designed to be filled with, various types of feeding and handling modules which provide limited room for any additional equipment.

Third, any programmer integrated with the production assembly system would apparently also have to interface with the control software and electronics of the production system software for communication and scheduling purposes. This would be a problem because production assembly system software was not only complex, but also confidential and/or proprietary to the manufacturers of those systems. This meant that the integration must be done with the cooperation of the manufacturers, who were reluctant to spend engineering effort on anything but improving their own systems, or must be done with a lot of engineering effort expended on understanding the manufacturers' software before working on the programmer's control software.

Fourth, the mechanical interface between a programmer and the production equipment needed to be highly accurate for placing programmed devices relative to the pick-and-place handling equipment of the production assembly system.

Fifth, there are a large number of different manufacturers of production handling equipment as well as production manufacturing equipment. This means that a large number of different production assembly system configurations would have to be studied and major compromises in design required for different manufacturers.

Sixth, the ideal system would allow for changing quickly between different micro devices having different configurations and sizes.

Seventh, the ideal system needed to be able to accommodate a number of different micro device feeding mechanisms including tape, tube, and tray feeders.

Finally, there was a need to be able to quickly reject micro devices which failed during the programming.

All the above problems seemed to render an effective solution impossible. This was especially true when trying to invent a comprehensive system which would be portable, allow "plug and play" operation with only external electric and air power, provide automated programming and handling, and be able to present programmed programmable devices to an automated production assembly system.

DISCLOSURE OF THE INVENTION

The present invention further provides a micro device assembly system programming system useable with a micro device using assembly system having a control system and a robotic handling system. An input feeder for providing micro devices is operatively associated with a programming system capable of programming micro devices. The input feeder and the programming system are capable of communication with the control system. The input feeder responds to communication with the control system to feed the micro devices, the programming system processes the micro devices and communicates with the control system, and the robotic handling system responds to the control system to take the micro devices and place the micro devices on the assembly system. This provides a system which can be quickly connected to a micro device using assembly system and provide processed micro devices at high speed.

The present invention further provides a micro device using assembly system for feeding, programming, and placing micro devices on circuit boards. A robotic handling system capable of picking up the micro devices and placing the micro devices on the circuit boards on a conveyor system. A control system controls the conveyor system and the robotic handling system. An input feeder provides micro devices in a linear row and a programming system is capable of programming a plurality of micro devices in sockets which are in line parallel with the linear row. The input feeder and the programming system are capable of communication with the control system. The input feeder responds to communication with the control system to feed the unprogrammed micro devices while the programming system positions and programs the plurality of micro devices and communicates to the control system. The robotic handling system responds to communication of the programming system with the control system to pickup and places the programmed micro devices on the circuit boards at high speed.

The above and additional advantages of the present invention will become apparent to those skilled in the art from a reading of the following detailed description when taken in conjunction with the accompanying drawings.

BRIEF DESCRIPTION OF THE DRAWINGS

FIG. 5 shows further alternate embodiment systems of the present invention.

BEST MODES FOR CARRYING OUT THE INVENTION

Figure 1:
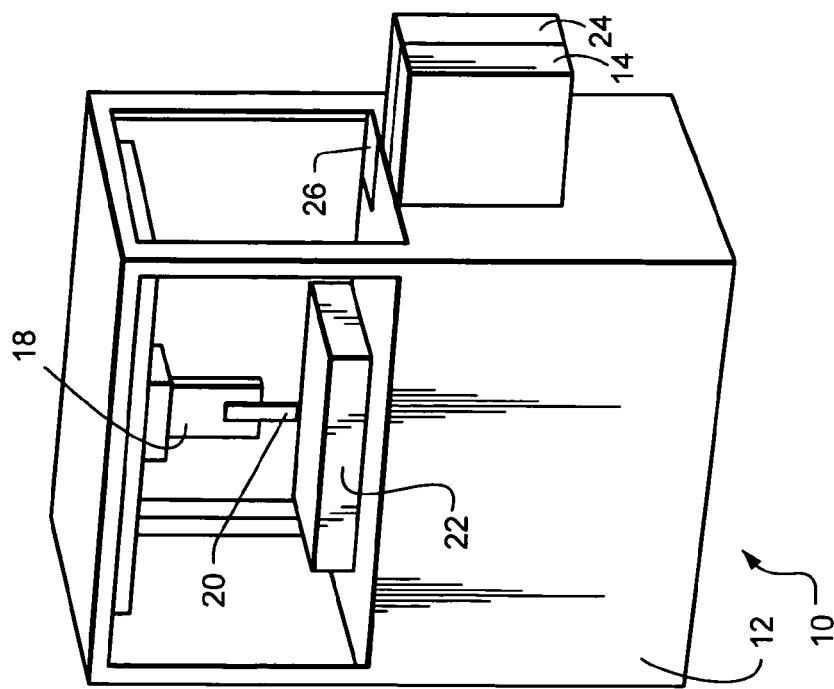
FIG. 1 (PRIOR ART) is an example of a prior art programming system.

Referring now to FIG. 1 (PRIOR ART), therein is shown a conventional processing system, such as a programming system 10 for programmable electronic devices. The programming system 10 is extremely large and has a rigid frame 12 to which an input feeder 14 is attached. The input feeder 14 can be a conventional tape and reel, which supplies unprogrammed devices to the programming system 10.

A robotic handling system 18, which is capable of moving in an X-Y-Z and θ coordinate system (with X and Y being horizontal movements, Z being vertical, and θ being angular), carries a pick-and-place (PNP) head 20 for picking up the unprogrammed devices and moving them into a programming area 22 and inserting them into programming sockets (not shown) in the programming system 10.

When the programming is complete, the robotic handling system 18 will move the PNP head 20 into place to remove the parts from the programming sockets and place them into an output mechanism 24. If the programmable devices could not be programmed, the robotic handling system 18 and the PNP head 20 will deposit the defective device into a reject bin 26.

The programming system 10 will continue to operate automatically until all the good devices in the input feeder 14 are programmed and transferred to the output mechanism 24.

Figure 2:
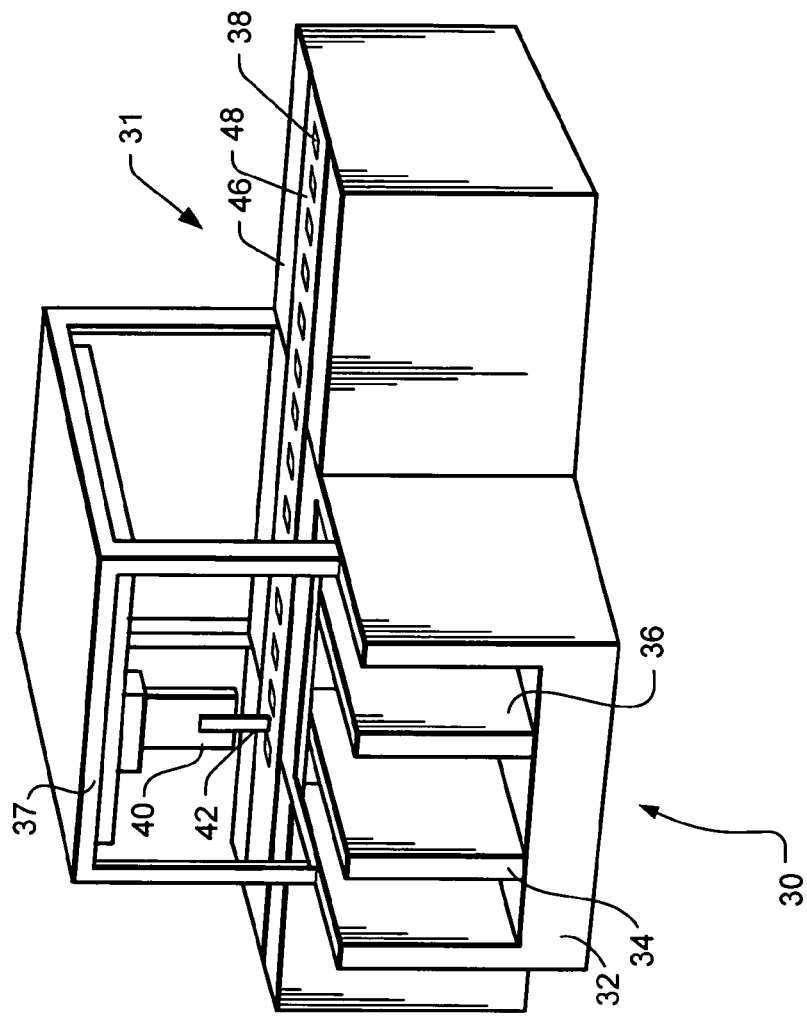
FIG. 2 (PRIOR ART) is an example of an electronic circuit board manufacturing line of the prior art which is a part of the present invention.

Referring now to FIG. 2 (PRIOR ART), therein is shown a production assembly system 30 which includes a micro device using assembly system 31. The production assembly system 30 includes a feeder table 32 where various input feeders, such as input feeder 34 and 36, are attached. Where programmed devices are involved, the output media from the output mechanism 24 from FIG. 1 (PRIOR ART) would be used as the input media in the input feeder 34. In FIG. 2 (PRIOR ART), two feeders 34 and 36 are shown installed, where each of the input feeders 34 and 36 could contain the same or different types of programmable devices. The input feeders 34 and 36 can be trays, tray stackers, tubes, tube stackers, or tapes and reels.

The production assembly system 30 has a support frame 37 which carries a robotic handling system 40, which is capable of carrying a PNP head 42 along an X-Y-Z-θ coordinate system to take devices from the input feeders 34 and 36 and place them on subassemblies, such as the printed circuit boards 38, as they are moved along a conveyor 48 which is mounted in an assembly system frame 46. The input feeders 34 and 36 are located offset from the direction of movement of the conveyor 48.

The robotic handling system 40 and the conveyor 48 are under the control of a software program running on a computer system (not shown). The software is capable of being modified so as to subject the robotic handling system 40 and the conveyor 48 subject to control by auxiliary equipment or to provide outputs to control auxiliary equipment.

Figure 3:
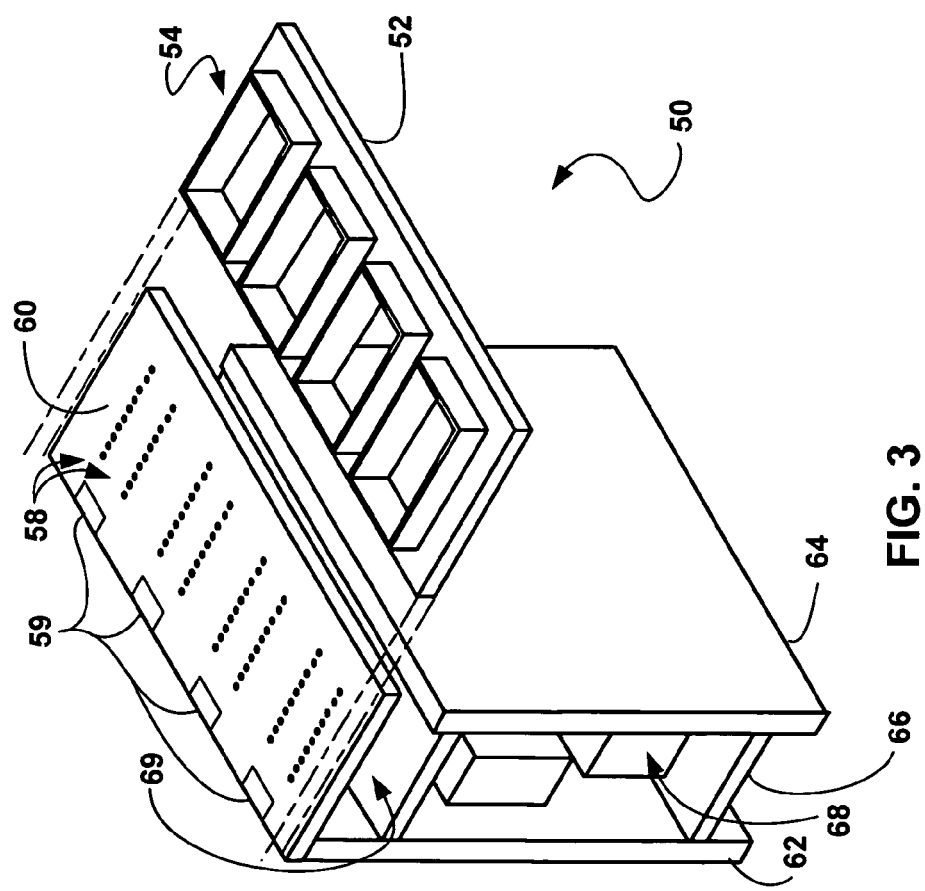
FIG. 3 is an isometric view of an embodiment of a programmer of the present invention.

Referring now to FIG. 3, therein is shown a programmer 50 of the present invention, which may be described as a "vertical", in-line programmer. The programmer 50 consists of a replaceable socket adapter 52 having a plurality of in-line programmable device sockets 54. The socket adapter 52 has a thickness, a width, and a depth which is larger than the width. The plurality of sockets 54 each extends through the thickness, extends across the width, and is in-line and parallel to the depth.

The socket adapter 52 allows for customization of different sizes of programmable devices by virtue of replacement by a socket adapter having different size sockets. Each of the sockets of the plurality of sockets 54 is a conventional socket of the type normally holding a single size programmable device. The number of the sockets in the plurality of sockets 54 is a function of the desired throughput or application of the programmer 50. In the mode shown there are four sockets 54.

The plurality of sockets 54 is positionable over a horizontally extending backplane 60. The backplane 60 has a thickness, a width, and a depth which is larger than the width. The size of the backplane 60 is approximately the same size as the socket adapter 52. The width and depth define a flat surface having a plurality of backplane contacts 58 configured to contact various pins on the programmable devices. The backplane 60 is connected by backplane connectors 59 to a vertically extending pin driver board 62 which provides an interface to a shorter, vertically extending controller card 64. The controller card 64 has a thickness, a width, and a depth where the width and depth define a flat surface. The backplane 60, the pin driver board 62, and the controller card 64 are held in a fixed relationship to each other by such expedients as screws, adhesives, welds, etc. combined with spacers, chassis, etc, such as the spacers 66.

The controller card 64 carries a microprocessor, controller, and/or other circuitry 68 for driving and programming the programmable devices. It should be noted that the backplane 60 is horizontal and is connected to the vertically extending pin driver board 62 which is horizontally connected to the vertical controller card 64. Where the width of the controller card 64 is less than the width of the pin driver board 62, a structure is formed with the backplane 60 cantilevered over the pin driver board 62 and the controller card 64 leaving a space 69 just beneath the backplane 60. Where it is desired that a tape, such as used for carrying programmable devices, passes as close to the plane of the socket adapter 52 as possible and be laterally removable, this cantilevered structure provides a unique solution. Further, the backplane 60 allows as many sockets 54 as desired to be placed in-line merely by adding to the depth.

Figure 4:
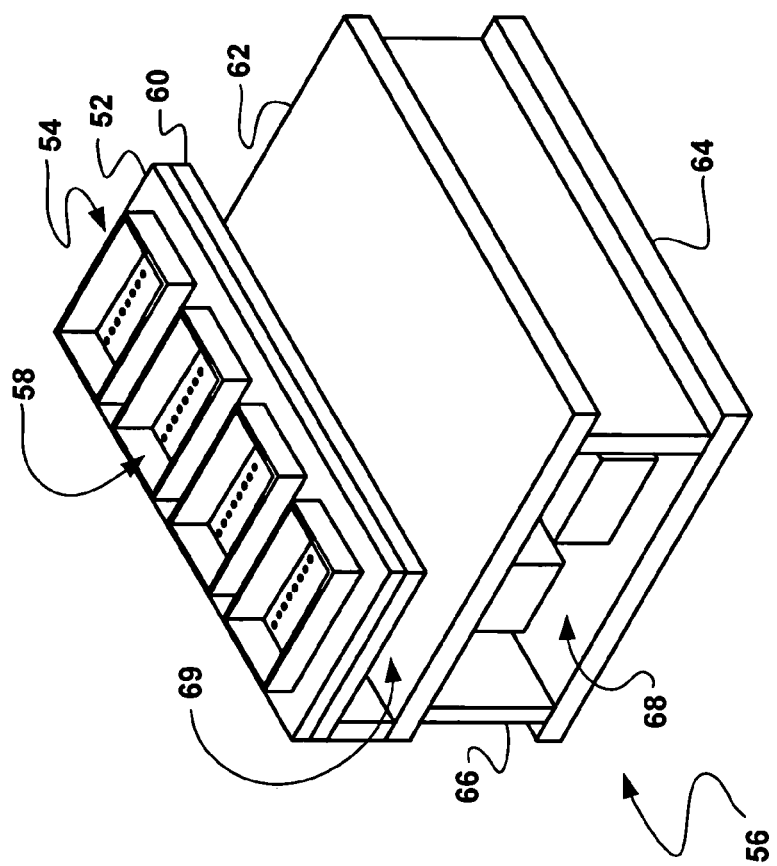
FIG. 4 is an isometric view of an alternate embodiment of a programmer of the present invention.

Referring now to FIG. 4, therein is shown a programmer 56 of the present invention, which may be described as a "horizontal", in-line programmer. Where the elements are the same as described for the programmer 50, shown in FIG. 3, the same numbers and descriptions are applicable.

The plurality of sockets 54 are in line and positionable over the horizontally extending backplane 60. The backplane 60 is connected by backplane connectors 59 to a horizontally extending pin driver board 62 which provides an interface to the horizontally extending controller card 64. It should be noted that for different configurations of the present invention, additional sockets could be added in parallel to the in line plurality of sockets 54 where width wise space permits.

Again, the backplane 60, the pin driver board 62, and the controller card 64 are held in a fixed relationship to each other by such expedients as screws, adhesives, welds, etc. combined with spacers, chassis, etc, such as the spacers 66.

This arrangement permits the programmer 56 to be placed in spaces where the vertical space is restricted or to be used as a stand alone, desktop system.

Referring now to FIG. 5, therein is shown alternate embodiments of programmer systems 70. The programmer systems 70 are connected to the production assembly system 30 which has the conveyor 48 passing under a robotic handling envelope 72 for the robotic handling system 40 and the PNP head 42. The robotic handling envelope 72 defines the area in which devices can be picked up and placed by the robotic handling system 40.

The programmer systems 70 are six embodiments of the present invention, which can be used independently or together, and incorporate the programmer 50. It should be understood, however, that the programmer systems 70 may use other programmers by modifications which would be apparent to those skilled in the art. The different programmer systems are designated as a "neighbor" system 75, an "open sandwich" system 80, a "closed sandwich" system 85, a "train" system 90, a "feeder shuttle" system 95, and a "matrix tray stacker" system 100. Except where indicated otherwise, the programmer systems 70 shown use a tape and reel input feeder, but a tray, tray stacker, tube, tube stacker, and a combination thereof may also be used without departing from the scope of the invention. In these embodiments using the tape and reel, the individual system has a width which parallels the conveyor 48, a depth which is perpendicular to the conveyor 48, and a height which is perpendicular to the width and depth.

A neighbor system 75 is a portable plug and play system which consists of an input feeder, such as the input feeder 34, neighboring the programmer 50. Both the pick-up point for parts from the input feeder 34 and the plurality of sockets 54 of the programmer 50 are under the robotic handling envelope 72 of the robotic handling system 40 of the production assembly system 30.

The neighbor system 75 consists of three individual systems: one is the input feeder 34, one is the programmer 50, and one is the robotic handling system 40. Both the input feeder 34 and the programmer 50 are in communication with control system which controls the robotic handling system 40.

The neighbor system 75 operates by having the input feeder 34 provide unprogrammed programmable devices. When the unprogrammed programmable devices are in position, the robotic handling system 40 uses its PNP head 42 to pick up an unprogrammed programmable device and transfer it to the programmer 50. The programmer 50 then programs the programmable device. When the programming is complete, a signal is sent to the robotic handling system 40 to remove the programmed programmable device and place it on the printed circuit board 38 on the conveyor 48. The programmer 50 also signals when a device is defective and should be deposited in a reject area 74. Basically, the communication between the input feeder 34 and the programmer 50 with the robotic handling system 40 lends itself to easy integration into the software/hardware system of the assembly system 30. For example, signals between the input feeder 34 and the robotic handling system 40 would respectively be to "advance a new unprogrammed device" and "an unprogrammed device is ready to be picked up". The signals between the programmer 50 and the robotic handling system 40 would also indicate whether a good or a bad programmable device was in a particular socket.

An open sandwich system 80 consists of the input feeder 34 with the programmer 50 beside it and a handling system 82 for moving unprogrammed programmable devices from the input feeder 34 to the programmer 50 and then removing the programmed programmable devices and putting them back into the input feeder 34 from where they would be picked up by the robotic handling system 40. The handling system 82 is an at least three-axis handling system for moving programmable devices horizontally and vertically through an envelope which covers the input feeder 34 and the programmer 50.

A closed sandwich system 85 has a pair of input feeders, such as the input feeders 34 and 36 with the programmer 50 sandwiched in between. The input feeder 34 has a handling system 86 and the input feeder 36. The handling system 86 would be capable of handling programmable devices among the input feeders 34 and 36 and the programmer 50 and would include a transfer mechanism 88, such as a small conveyor belt.

In operation, the input feeder 34 provides the unprogrammed programmable devices to be picked up by the handling system 86 and placed on the transfer mechanism 88. With a long transfer mechanism 88, a number of programmable devices could be put in place simultaneously or sequentially for the handling system 86, or a sub-unit of the handling system 86, to pick up simultaneously for simultaneous placement in the programmer 50. After programming, the programmed programmable devices are simultaneously picked up by the handling system 86, or a sub-unit, and placed on the input feeder 36 to be moved by the input feeder 36 to the pick point to be picked up individually or simultaneously by the robotic handling system 40. Again, only simple signals need be sent to the control system or be sent by the control system to the input feeder 34.

A train system 90 has the input feeder 34 and the programmer 50 colinearly positioned. A handling system 92 moves parts in one horizontal direction and one vertical direction from the input feeder 34 to the programmer 50, and the robotic handling system 40 removes the programmed programmable devices from the programmer 50. In some of the train system 90, it is desirable that the tape pass through the programmer 50 and the cantilevered configuration with the space 69 of the programmer 50 is particularly valuable for this train system 90. The robotic handling system 40 then picks the programmed programmable devices out of the sockets 54 which are under the robotic handling envelope 72 for the assembly system 30.

A feeder shuttle system 95 has the sockets 54 of the programmer 50 parallel to the direction of the conveyor 48 and outside of the table 32. A handling system 96 picks up unprogrammed programmable devices from a feeder shuttle area 97 just by moving in a direction parallel to the conveyor 48 and in one direction vertically to put them in the programmer 50. The handling system 96 further takes programmed programmable devices out of the programmer 50 and places them on a transfer mechanism 98, such as a mini-conveyor belt, which is perpendicular to the conveyor 48 and which brings the programmable devices under the robotic handling envelope 72 from where they would be picked up under the control of the control system by the robotic handling system 40.

A matrix tray stacker system 100 has the programmer 50 located at the side of the table 32 and perpendicular to the conveyor 48. It has an associated handling system 102 which picks unprogrammed programmable devices from a matrix tray area 103 and places them into the programmer 50 using at least two axes of motion. The handling system 102 further picks up the programmed programmable devices and places them on a transfer mechanism 104, such as a mini-conveyor, using a third axis of motion for transport under the robotic handling envelope 72 from where they would be picked up by the robotic handling system 40 under the control of the control system.

As would be evident to those skilled in the art, minimal communication is required among the input feeder 34, the programmer 50, and the production assembly system 30. Further, as shown in the drawings, the plurality of programmer systems 70 are portable and located immediately adjacent to the input feeder 34 and positionable adjacent to the production assembly system 30 to shorten the robotic handling moves and thus increase the throughput of the combined systems 70 and 30.

From the above, it will also be understood that the present invention is applicable to what can be described as "micro devices". Micro devices include a broad range of electronic and mechanical devices. The best mode describes processing which is programming for programmable devices, which include but are not limited to devices such as Flash memories (Flash), electrically erasable programmable read only memories ($E^2PROM$), programmable logic devices (PLDs), field programmable gate arrays (FPGAs), and microcontrollers. However, the present invention encompasses processing for all electronic, mechanical, hybrid, and other devices which require testing, measurement of device characteristics, calibration, and other processing operations. For example, these types of micro devices would include but not be limited to devices such as microprocessors, integrated circuits (ICs), application specific integrated circuits (ASICs), micro mechanical machines, micro-electro-mechanical (MEMs) devices, micro modules, and fluidic systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A micro device assembly system programming system useable with a micro device using assembly system having a control system and a robotic handling system, comprising:
    an input feeder for providing unprogrammed micro devices in a linear row;
    a programming system capable of programming a plurality of unprogrammed micro devices, the programming system adjacent to the input feeder and positionable adjacent to the assembly system, the programming system having a plurality of in-line sockets for positioning micro devices for programming; and
    the input feeder and the programming system capable of communication with the control system, the input feeder responsive to communication with the control system to feed the unprogrammed micro devices, the programming system capable of positioning and programming the plurality of micro devices and communicating to the control system, and the robotic handling system responsive to communication of the programming system with the control system to take the micro devices and place the micro devices on the assembly system.

2. The micro device assembly system programming system as claimed in claim 1 including:
 a handling system operatively associated with the input feeder and the programming system, the handling system for moving micro devices from the input feeder and positioning the micro devices on the programming system.

3. The micro device assembly system programming system as claimed in claim 2 wherein:
 the input feeder is capable of providing the micro devices in a linear row;
 the programming system has the plurality of in-line sockets parallel to the linear row of micro devices provided by the input feeder; and
 the handling system is capable of at least two axes of movement for moving micro devices from the linear row of the input feeder to the linear row of the programming system.

4. The micro device assembly system programming system as claimed in claim 3 wherein:
 the handling system is capable of only two axes of movement for moving micro devices from the linear row of the input feeder to the linear row of the programming system; and
 the input feeder and the programming system are collinear with the linear row of the input feeder collinear with the linear row of the programming system.

5. The micro device assembly system programming system as claimed in claim 3 including:
 a transfer mechanism operatively associated with the programming system for moving micro devices between the input feeder and the robotic handling system.

6. The micro device assembly system programming system as claimed in claim 5 wherein:
 the handling system is capable of moving micro devices from the programming system to the transfer mechanism; and
 the transfer mechanism is capable of moving micro devices between the programming system and the robotic handling system for pickup by the robotic handling system.

7. The micro device assembly system programming system as claimed in claim 5 wherein:
 the handling system is capable of moving micro devices from the programming system to the transfer mechanism; and
 the transfer mechanism is capable of moving micro devices in a linear row perpendicular to the plurality of in-line sockets for pickup by the robotic handling system.

8. The micro device assembly system programming system as claimed in claim 5 wherein:
 the handling system is capable of moving a fixed plurality of micro devices simultaneously from the input feeder to the transfer mechanism; and
 the transfer mechanism is capable of moving the fixed plurality of micro devices between the input feeder and the programming system; and
 the handling system is capable of moving the fixed plurality of micro devices simultaneously from the transfer mechanism to the programming system.

9. The micro device assembly system programming system as claimed in claim 6 including:
 a second input feeder for moving micro devices between the programming system and the robotic handling system;
 and wherein:
 the handling system is capable of moving the fixed plurality of micro devices from the programming system to the second input feeder for pickup by the robotic handling system.

10. The micro device assembly system programming system as claimed in claim 9 wherein:
 the transfer mechanism is capable of moving the micro devices in the opposite direction from which the linear row is provided by the input feeder.

11. A micro device using assembly system for feeding, programming, and placing micro devices on circuit boards, comprising:
 a longitudinally extending conveyor system for the circuit boards;
 a robotic handling system capable of picking up the micro devices and placing the micro devices on the circuit boards;
 a control system for controlling the conveyor system and the robotic handling system;
 an input feeder for providing micro devices in a linear row, the input feeder having a width, a height, and a depth greater than the width, the input feeder having its depth perpendicular to and offset from the longitudinal length of the conveyor system;
 a programming system capable of programming a plurality of micro devices, the programming system adjacent to the input feeder and positioned adjacent to the assembly system, the programming system having at least a plurality of in-line sockets for positioning micro devices for programming, the sockets in line parallel with the depth of the input feeder; and
 the input feeder and the programming system capable of communication with the control system, the input feeder responsive to communication with the control system to feed the unprogrammed micro devices, the programming system capable of positioning and programming the plurality of micro devices and communicating to the control system, and the robotic handling system responsive to communication of the programming system with the control system to pickup the micro devices and place the micro devices on the circuit boards.

12. The assembly system as claimed in claim 11 including:
 a handling system operatively associated with the input feeder and the programming system, the handling system for moving micro devices from the input feeder and positioning the micro devices on the programming system.

13. The assembly system as claimed in claim 12 wherein:
 the input feeder is capable of providing the micro devices in a linear row;
 the programming system has the plurality of in-line sockets parallel to the linear row of micro devices provided by the input feeder and perpendicular to the conveyor system; and
 the handling system is capable of at least two axes of movement for moving micro devices from the linear row of the input feeder to the linear row of the programming system.

14. The assembly system as claimed in claim 13 wherein:
the handling system is capable of only two axes of movement for moving micro devices from the linear row of the input feeder to the linear row of the programming system; and
the input feeder and the programming system are collinear with the linear row of the input feeder collinear with the linear row of the programming system.

15. The assembly system as claimed in claim 13 including:
a transfer mechanism operatively associated with the programming system for moving micro devices between the input feeder and the robotic handling system.

16. The assembly system as claimed in claim 15 wherein:
the handling system is capable of moving micro devices from the programming system to the transfer mechanism; and
the transfer mechanism is capable of moving micro devices between the programming system and the robotic handling system for pickup by the robotic handling system.

17. The assembly system as claimed in claim 15 wherein:
the handling system is capable of moving micro devices from the programming system to the transfer mechanism; and
the transfer mechanism is capable of moving micro devices in a linear row perpendicular to the plurality of in-line sockets for pickup by the robotic handling system..

18. The assembly system as claimed in claim 15 wherein:
the handling system is capable of moving a fixed plurality of micro devices simultaneously from the input feeder to the transfer mechanism; and
the transfer mechanism is capable of moving the fixed plurality of micro devices between the input feeder and the programming system; and
the handling system is capable of moving the fixed plurality of micro devices simultaneously from the transfer mechanism to the programming system.

19. The assembly system as claimed in claim 16 including:
a second input feeder for providing micro devices in a linear row, the second input feeder having a width, a height, and a depth greater than the width, the second input feeder having its depth perpendicular to and offset from the longitudinal length of the conveyor system; and wherein:
the handling system is capable of moving the fixed plurality of micro devices from the programming system to the second input feeder for pickup by the robotic handling system.

20. The assembly system as claimed in claim 19 wherein:
the transfer mechanism is capable of moving the micro devices in the opposite direction from which the linear row is provided by the input feeder.

21. The assembly system as claimed in claim 11 including:
a reject area accessible by a system selected from a group consisting of the handling system, the robotic handling system, and a combination thereof.

22. The assembly system as claimed in claim 11 wherein:
the input feeder is selected from a group of input feeder sources consisting of a tape and reel, a tray, tray stacker, tube, tube stacker, and a combination thereof.

* * * * *